United States Patent
Rodriguez

(10) Patent No.: US 9,823,308 B2
(45) Date of Patent: Nov. 21, 2017

(54) METHOD FOR MONITORING DEMAGNETIZATION

(71) Applicant: ABB Schweiz AG, Baden (CH)

(72) Inventor: Pedro Rodriguez, Vasteras (SE)

(73) Assignee: ABB Schweiz AG, Baden (CH)

( * ) Notice: Subject to any disclaimer, the term of this patent is extended or adjusted under 35 U.S.C. 154(b) by 755 days.

(21) Appl. No.: 14/066,307

(22) Filed: Oct. 29, 2013

(65) Prior Publication Data

US 2014/0049285 A1    Feb. 20, 2014

Related U.S. Application Data

(63) Continuation of application No. PCT/EP2012/057555, filed on Apr. 25, 2012.

(30) Foreign Application Priority Data

Apr. 29, 2011 (EP) .................... 11164289

(51) Int. Cl.
 *G01R 5/12* (2006.01)
 *G01R 31/34* (2006.01)
 *G01H 1/00* (2006.01)
 *H02P 29/02* (2016.01)

(52) U.S. Cl.
 CPC ........... *G01R 31/343* (2013.01); *G01H 1/003* (2013.01); *H02P 29/02* (2013.01)

(58) Field of Classification Search
 CPC .......... G01D 5/145; G01D 5/12; G01R 33/34; G01R 33/12
 USPC .............. 324/765.01, 701, 623, 200–207.26, 324/209–263; 318/480, 400.33, 400.21, 318/701, 490; 310/156.43, 268
 See application file for complete search history.

(56) References Cited

U.S. PATENT DOCUMENTS

| | | |
|---|---|---|
| 3,481,184 A | 12/1969 | Boyd |
| 4,408,160 A | 10/1983 | King et al. |
| 5,365,787 A | 11/1994 | Hernandez et al. |

(Continued)

FOREIGN PATENT DOCUMENTS

| | | | | |
|---|---|---|---|---|
| CN | 101710162 A | * | 5/2010 | ............. G01R 31/06 |
| CN | 101782475 A | | 7/2010 | |

(Continued)

OTHER PUBLICATIONS

Satish (IEEE, Publication dated Sep. 2007 2061, vol. 22, No. 5, Dynamic Eccentricity and Demagnetized Rotor Magnet Detection in Trapezoidal Flux (Brushless DC) Motors Operating Under Different Load Conditions), 2061-2069.*

(Continued)

*Primary Examiner* — Patrick Assouad
*Assistant Examiner* — Taqi Nasir
(74) *Attorney, Agent, or Firm* — Whitmyer IP Group LLC

(57) ABSTRACT

A method for discovering demagnetisation faults of a permanent magnet synchronous generator, such as a wind power generator. The method is performed during operation of the synchronous generator and includes measuring the vibration of the stator, performing a frequency analysis of the vibration, and deducing whether the generator suffers from demagnetization of a permanent magnet, from the vibration analysis. Moreover, geometric eccentricity faults and electric short circuit faults may also be detected from the vibration.

18 Claims, 1 Drawing Sheet

(56) References Cited

U.S. PATENT DOCUMENTS

| | | | |
|---|---|---|---|
| 6,037,769 A | 3/2000 | Hoon et al. | |
| 6,474,166 B1 | 11/2002 | Osawa et al. | |
| 6,583,531 B1 * | 6/2003 | Asano | H02K 1/08 310/156.22 |
| 7,324,008 B2 | 1/2008 | Payne et al. | |
| 8,610,452 B2 * | 12/2013 | Lee | G01R 31/343 318/490 |
| 2003/0051929 A1 * | 3/2003 | Raftari | B60K 6/445 180/65.235 |
| 2003/0055584 A1 * | 3/2003 | Raftari | B60K 6/26 702/58 |
| 2004/0128105 A1 * | 7/2004 | Harke | H02P 6/18 702/151 |
| 2007/0176428 A1 * | 8/2007 | Nagao | F03D 7/0296 290/44 |
| 2011/0018727 A1 | 1/2011 | Bharadwaj et al. | |
| 2011/0103934 A1 * | 5/2011 | Ohtachi | F04D 19/042 415/118 |
| 2011/0191034 A1 * | 8/2011 | Lee | G01R 31/343 702/35 |
| 2011/0260748 A1 * | 10/2011 | Lee | G01R 31/343 324/765.01 |

FOREIGN PATENT DOCUMENTS

| | | | | |
|---|---|---|---|---|
| CN | 101858778 A | 10/2010 | | |
| EP | 1489321 A1 * | 12/2004 | | H02P 6/10 |
| EP | 1508842 A2 | 2/2005 | | |
| EP | 1921455 A2 | 5/2008 | | |
| JP | S62171489 A | 7/1987 | | |
| JP | S6319803 A | 1/1988 | | |
| JP | H04215030 A | 8/1992 | | |
| JP | 2001074547 A | 3/2001 | | |
| JP | 2004328822 A | 11/2004 | | |
| JP | 2006223097 A | 8/2006 | | |
| JP | 2008116408 A | 5/2008 | | |
| JP | 2010288352 A | 12/2010 | | |
| JP | 2011024313 A | 2/2011 | | |
| JP | 2011055651 A | 3/2011 | | |
| WO | 2007037140 A1 | 4/2007 | | |
| WO | WO 2011006528 A1 * | 1/2011 | | G01R 31/343 |

OTHER PUBLICATIONS

First Office Action from Japan Application No. 2014-506846 dated Nov. 4, 2014 4 pages.

Hajiaghajani, et al.; "A method for detection of eccentricity in permanent magnet machines"; Industry Applications Conference, 2003. 38th IAS Annual Meeting. Conference Record of the (vol. 3 ); Oct. 12-16, 2003; 1833-1838 vol. 3.

Rajagopalan, et al.; "Dynamic Eccentricity and Demagnetized Rotor Magnet Detection in Trapezoidal Flux (Brushless DC) Motors Operating Under Different Load Conditions"; Power Electronics, IEEE Transactions on (vol. 22 , Issue: 5 ); Sep. 2007 ; 2061-2069.

Ruschetti, et al."Effects of partial rotor demagnetization on permanent magnet synchronous machines"; Industrial Technology (ICIT), 2010 IEEE International Conference on; Mar. 14-17, 2010 ; 1233-1238.

European Search Report Application No. EP 11 16 4289 Completed: Mar. 19, 2012; dated Mar. 30, 2012 11 pages.

International Peliminary Report on Patentability Application No. PCT/EP2012/057555 Completed: Mar. 27, 2013 6 pages.

International Search Report and Written Opinion of the International Searching Authority Application No. PCT/EP2012/057555 Completed: May 29, 2012; dated Jun. 8, 2013 13 pages.

Ebrahimi, et al.; :"Static-, Dynamic-, and Mixed-Eccentricity Fault Diagnoses in Permanent-Magnet Synchronous Motors"; IEE Transaactions on Industrial Electronics, vol. 56 No. 11 Nov. 2009; p. 4727-4739.

Rosero, et al.; "Study on the Permanent Magnet Demagnetization Fault in Permanent Magnet Synchronous Machines"; IEEE Industrial Electronics, IECON 2006—32nd Annual Conference on; Nov. 6-10, 2006; 879-884.

* cited by examiner

METHOD FOR MONITORING DEMAGNETIZATION

FIELD OF THE INVENTION

The invention relates to systems for monitoring a permanent magnet synchronous machine, such as a generator. Especially it concerns monitoring magnetic faults of the permanent magnets of a synchronous generator, for example in a permanent magnet synchronous generator for wind power generation.

BACKGROUND OF THE INVENTION

An important factor enabling high reliability at electric power plants is to provide generators, such as wind generators, with condition monitoring systems in order to detect faults at an early stage. The invention aims to provide an improved diagnosing method for detecting and identifying magnetic faults of permanent magnet synchronous generators (PMSG), especially for wind power permanent magnet synchronous generators. Permanent magnets synchronous generators are one of the common machines in the wind generation industry. Detecting demagnetization is important since it produces degradation of the machine performance. There have been methods for detecting demagnetization based on monitoring the back EMF (electromotive force) and the stator current of the generators.

However, when monitoring those indicators, there is a risk that wrong information could be given since other faulty conditions produce similar signatures than demagnetization.

U.S. Pat. No. 7,324,008 (D1) describes analyzing an electrical machine using finite element method (FEM) analysis with at least one fault condition to be able to predict the effect of the fault condition. The result of the FEM analysis can be used to identify the analyzed faults from live measurements of the machine (see D1, abstract). D1 describes a transverse flux motor but also suggests that similar FEM analysis with a fault could be used for other electrical machines (see D1, column 7, line 26-50). D1 suggests simulating magnetic faults and the effect of the magnetic faults to the magnetic flux, so that measurements of the magnetic flux, by means of "search coils", can be used as an indication of magnetic faults (see D1, column 1, lines 46-51). The method described in D1 provides means for detecting faults that degrade the magnetic strength of magnets due to overheating and/or demagnetization (see D1, column 6, line 15-16).

In the technical field it is also important to monitor the rotor bearings. The condition of the rotor bearings of generators for wind turbines are often monitored by measuring the vibration close to the bearings.

D1 suggests analyzing other fault conditions, such as mechanical and electrical misalignments, and suggests also using other sensors for monitoring the machine, in addition to the coils used for sensing the magnetic flux (see D1, column 7, line 27-31), such other sensors as temperature, vibration and current sensors.

The invention concerns diagnosis of permanent magnet synchronous machines, especially detecting magnetic faults of generators, and provides an alternative to using search coils.

The article "Static-, Dynamic-, and Mixed-Eccentricity Fault Diagnoses in Permanent-Magnet Synchronous Motors", Ebrahimi et al, IEEE TRANSACTIONS ON INDUSTRIAL ELECTRONICS, VOL. 56, NO. 11, NOVEMBER 2009 4727, (D4) indicates how static-, dynamic- and mixed-eccentricities influences the current frequency spectra with amplitudes in sideband components of the stator current frequency. Also, D4 describes how the current spectra are influenced by demagnetisation, short circuit faults and open circuit faults, and can be distinguished from the eccentricity faults by not creating sideband components. The invention provides an alternative to the current spectrum analysis for discovering demagnetisation, as described in D4, but can also be used in addition to such stator current analysis.

D1 and D4 are considered the most relevant prior art documents, but reference will in the following be made to a few documents concerning solving other technical problems than discovering demagnetization of permanent magnets in synchronous machines.

US2011/0018727 (D2) describes a method and device for performing wind turbine generator fault diagnostics, wherein sensors monitor a wind generator and signals from the sensors are analyzed to detect anomalies that indicate faults. The method that is described in D2 evaluates (see D2, FIG. 1) electrical signals (voltage, current), vibration signals and temperature signals. The electrical signals and vibration signals are subjected to respective spectral analysis (see D2, references 110 and 120) (such as an FFT or Fast Fourier Transform). The spectra are subjected to signature analysis (see D2, references 140 and 142) and anomaly detection (see D2, references 150 and 154). Transients in the temperature are detected and anomalies of the temperature identified (see D2, reference 156). Upon detecting anomalies in the electric and vibration spectra, respectively, and in the temperature, it is concluded that the generator system has electrical or mechanical faults (see D2, paragraph [0009]). Vibration signals from an accelerometer and a voltage signature determined from the generator voltage signals may be used to detect an underlying eccentricity fault (see D2, paragraph [0010]). The document describes generators in a general way and does not describe detection of magnetic faults, and especially not detecting magnetic faults in permanent magnet synchronous generators.

Analysis of the vibration signals has been used to diagnose faults of electric machines, see Jover Rodriguez, P. V., 2007, "Current-, Force-, and Vibration-Based Techniques for Induction Motor Condition Monitoring", Doctoral Dissertation, Helsinki University of Technology, Finland (D3), which may be found at http://lib.tkk.fi/Diss/2007/isbn9789512289387/isbn9789512289387.pdf D3 describes analyzing the frequency spectra of stator vibrations in an asynchronous motor. The aim of this research was to discover the best indicators of induction motor faults, as well as suitable techniques for monitoring the condition of induction motors. D3 describes the effects of electromagnetic force on the vibration pattern when the motor is working under fault conditions. Moreover, D3 describes a method that allows the prediction of the effect of the electromechanical faults in the force distribution and vibration pattern of the induction machines. In D3, FEM computations are utilized, which show the force distributions acting on the stator of the electrical machine when it is working under an electrical fault. It is shown that these force components are able to produce forced vibration in the stator of the machine. The results were supported by vibration measurements. The low-frequency components could constitute the primary indicator in a condition monitoring system. D3 uses vibrational analysis to detect faults of an induction motor, which faults are broken rotor bars, broken end ring, inter-turn short circuit, bearing and eccentricity failures.

SUMMARY OF THE INVENTION

An aim of the invention is to provide a method for detecting magnetic problems, which is easy to use, still being reliable. The present invention provides a method for detecting magnetic faults of a permanent magnet synchronous machine comprising a stator with windings and terminals for the machine currents, and a rotor provided with permanent magnets, which rotor is rotatably arranged within the stator. By detecting and identifying magnetic faults, especially demagnetization of a permanent magnet, reparation of a machine is facilitated, since exchanging the permanent magnets of the rotor will remove the malfunction and improve the performance. For these purposes, the present invention provides a method for monitoring demagnetization of permanent magnets in a synchronous machine. The method is performed during operation of the synchronous machine. The method includes measuring the vibration of the stator, performing a frequency analysis of the vibration, determining, on the basis of whether the magnitude of the vibration at the supply frequency ($f_S$) of the stator exceeds a threshold value or not, whether the machine suffers from demagnetization of a permanent magnet or not.

Although, this application mainly describes monitoring and fault analysing of permanent magnet synchronous generators, the invention is also beneficial for monitoring and fault analysing of permanent magnet synchronous motors.

According to one embodiment of the invention, the method further comprises the step of determining, on the basis of whether the magnitude of the vibration at the rotation frequency ($f_R$) exceeds a threshold value or not, whether the machine suffers from demagnetization of a permanent magnet or not.

Demagnetization of a permanent magnet in a synchronous machine affects the vibration spectrum at the stator supply frequency ($f_S$) and at the rotation frequency ($f_R$) of the rotor. Monitoring the vibration at the stator supply frequency ($f_S$) can be used to discover a magnetic fault, and distinguish the magnetic fault from other faults, such as electric and geometric faults. Monitoring also the vibration magnitude at the rotation frequency makes the deduction of a magnetic fault clearer.

Measuring the vibration provides an easy way to monitor demagnetization. The invention makes it possible to deduce that a permanent magnet synchronous machine suffers from demagnetization of a permanent magnet from the vibration alone. The vibration measurement may include detecting vibrations by means of a vibration sensor that is fixed to a frame of the stator or fixed to the stator. For example, the inventive method can be realized by the following steps; positioning and fixing a vibration sensor, such as an accelerometer or accelerometers, to the stator frame; measuring the vibration of the stator frame; analyse the frequencies of the vibration signal from the accelerometer; identify magnitudes of frequencies indicating demagnetisation and determine if the generator suffers from demagnetisation of a permanent magnet.

Search coils or other electrical measurements are not needed. Demagnetization faults can be identified from the magnitude of the vibration at the supply frequency of the stator or at the rotation frequency of the rotor.

The method can be implemented in monitoring equipment that can be connected to a permanent magnet synchronous generator, e.g. attaching an accelerometer to the stator frame or connecting an already installed accelerometer to a computing device, provided with diagnostic means, of the monitoring equipment.

Alternatively, the method can be implemented in a control system of, for example, a wind power plant having wind turbines comprising permanent magnet synchronous generators, which control system receives vibration signals from vibration sensors fixated at the respective stator frames of the generators, which method is implemented in such a control system by analyzing the vibration signals and detecting magnetic faults from the frequency spectra of these vibration signals.

The invention provides a method that can be used to identify demagnetisation, from vibrations alone. Current measurements can be made in addition to the vibration sensing. In an embodiment, the method includes measuring at least one current of the stator, preferably each branch current, and performing a frequency analysis for the current, such as for each branch current. Preferably, the method includes monitoring frequencies of the current spectrum indicating electric faults, magnetic faults and/or geometric faults, to find indications of such faults in the current or currents. In an embodiment, the system comprises means for frequency analysis of a stator current and means for determining faults based on the frequency analysis.

DETAILED DESCRIPTION OF THE INVENTION

Figure 1:
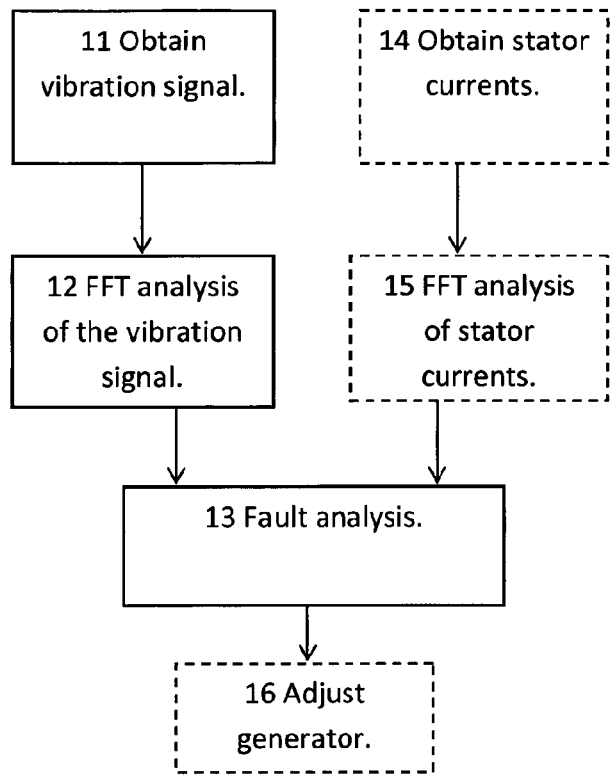
FIG. 1 shows a method for detecting demagnetisation faults in accordance with the invention.

FIG. 1 illustrates a method for detecting magnetic faults on a permanent magnet synchronous generator. The method starts by obtaining 11 a vibration signal from a permanent magnet synchronous generator. The obtained signal is subjected to a frequency analysis 12 wherein the vibration signal is divided into a spectrum of frequencies and the magnitude of each frequency is calculated. The frequency analysis 12 is suitably performed by an FFT-analysis (Fast Fourier Transform) or the like for the stationary case, or, for example, using a discrete wavelet transform during transients due to the wind speed variations. The magnitudes in the spectrum of vibration frequencies of a faulty generator may deviate from those of a properly operating generator. The spectrum is therefore subjected to a fault analysis (step 13), which monitor the magnitudes of the vibration frequencies to discover faults in the generator, especially a demagnetisation of a permanent magnet of the generator. In more detail, the fault analysing step monitors the magnitudes of the vibration at the stator supply frequency ($f_S$) and the rotation frequency ($f_R$) of the rotor. Heightened levels at these two frequencies in the vibration spectrum indicate a deviation of magnetic level of a permanent magnet in the rotor. The obtaining step 11 may include a plurality of sub steps, for example, positioning and fixing a vibration or motion sensor, such as one or more accelerometers, and possibly also, as an alternative or in addition, electronic gyroscopes, to the stator or a frame to which the stator is secured. The obtaining step 11 may also include the substeps of measuring vibrations by means of the sensor, and the substep of transferring the vibration signal to fault analysing equipment, including receiving the vibration signal in the fault analysing equipment.

Preferred embodiments of the present invention includes detecting other faults in addition to the demagnetization faults, which other faults are geometric faults, such as a static or dynamic eccentricity, or a mixed eccentricity, and electric faults, such as short circuit of stator windings. A similar FEM modelling technique as used in D3 may be used to provide reliable diagnostic methods for fault detection of the permanent magnet synchronous generator in question.

The method of FIG. 1 illustrates obtaining 14 and analysing 15 the frequency of each stator branch current as optional steps (as indicated by broken lines) to provide an enhanced basis for the fault analysis 13. In such an embodiment, the fault analyser is adapted to deduce magnetic, electric and geometric faults from both the stator currents and the stator vibration.

The fault analysis 13 may be followed by subsequently correcting the detected faults (step 16), such as substituting a faulty permanent magnet, and/or adjusting other detected faults of the generator.

Figure 2:
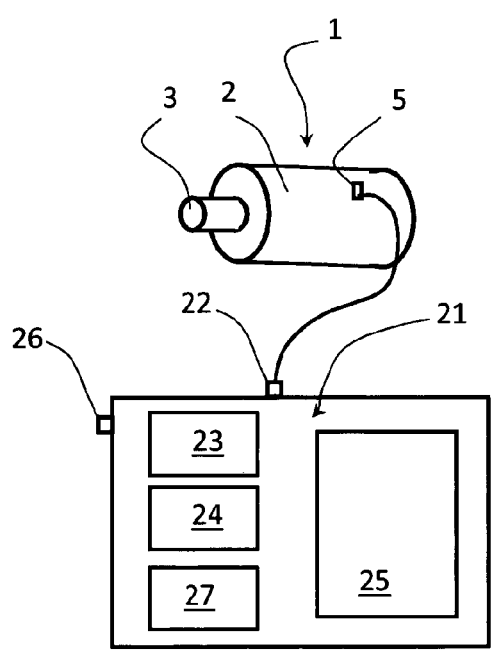
FIG. 2 shows a system for detecting faults in accordance with the invention.

FIG. 2 illustrates a vibration sensor 5 communicatively connected to a fault analyser 21 with means for analysing vibration signals to detect magnetic faults of a permanent magnet synchronous generator. The vibration sensor is secured to a permanent magnet synchronous generator 1 to sense the vibrations of a stator 2 of the generator 1, and is arranged to obtain the vibration signals for analysis upon rotation of the rotor 3 of the synchronous generator 1. The fault analyser 21 comprises a vibration signal interface 22, exemplified by a sensor interface 22 for receiving a wired or wireless connection to a vibration sensor, such as an accelerometer, and receiving vibration signals, a spectrum analyser 23, a fault identifier 24 and an output for an operator in the form of a display 25. The spectrum analyser 23 is adapted to analyse the frequency spectrum of a vibration signal received by the fault analyser 21. For this purpose the spectrum analyser 23 applies a Fourier transform or a time frequency decomposition to the received signal, for example use a FFT (Fast Fourier Transform) or wavelet transform and produces amplitude levels for the frequencies constituting the vibration signal, so that the signatures of the frequency components of the vibration can be identified. The fault identifier 24 receives the frequency spectrum including the magnitudes of each respective frequency from the spectrum analyser 23. The fault identifier 24 is adapted to identify the frequency signatures of the vibration signal, and to link these signatures to a specific fault condition, especially identifying frequencies having magnitudes differing from a healthy generator and deducing what type of fault the generator is suffering from. The fault identifier 24 is especially adapted to identify demagnetisation of the permanent magnets of the generator by monitoring the frequencies of the vibration spectrum indicating a demagnetisation fault and monitoring the magnitudes of these frequency components of the spectrum. To be able to estimate the severity of a vibration frequency indicating a demagnetisation fault, the fault identifier suitably includes, or has access to a memory, with reference data, such as magnitude levels corresponding to levels of demagnetisation. This reference data can be created by measuring a generator, or a motor, during operation with a faulty permanent magnet, such as a permanent magnet less strong than the nominal magnetic strength of the permanent magnets normally used in the machine. For example, using a permanent magnet having 80 percent of the strength of the permanent magnets of a generator during normal operation, and measuring the vibration gives a measure of the size of demagnetisation faults. The magnitudes of the vibration at a demagnetisation fault indicating frequency can suitably be interpolated and extrapolated from results from simulations and also approximated to be proportional to the level of demagnetisation. An alternative method to obtain reference data to the fault identifier 24 of the fault analyser 21 is to perform a FEM-modelling of the generator with different levels of demagnetisation of the permanent magnets.

Figure 3:
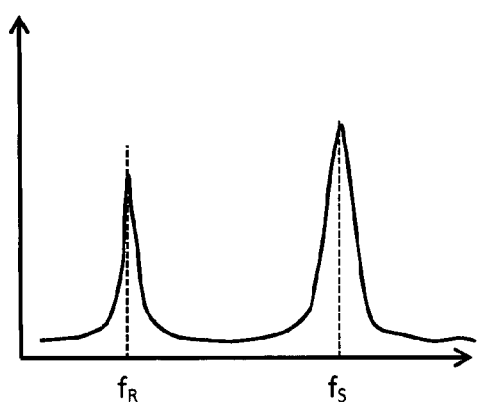
FIG. 3 illustrates a vibration spectrum indicating a demagnetisation fault.

The signature for demagnetisation is seen in the vibration frequency spectrum, especially at the rotation frequency ($f_R$) of the rotor and the stator supply frequency ($f_S$) (see FIG. 3). The frequency component that gives the best indication of a demagnetisation fault is the supply frequency ($f_S$) of the stator. In a healthy machine there is substantially no vibration at this frequency i.e. the magnitude of the vibration at the supply frequency ($f_S$) of the stator is close to zero. Therefore, the fault identifier 24 is adapted to compare the magnitude of the vibration at the supply frequency ($f_S$) of the stator with the reference data. On the basis of the reference data a threshold value for a fault condition can be determined. If the magnitude of the vibration at the supply frequency ($f_S$) of the stator exceeds the threshold value, the fault identifier 24 determines that the machine suffers from demagnetization of a permanent magnet. Otherwise the fault identifier 24 determines that the machine does not suffer from demagnetization of a permanent magnet.

Even in a healthy machine there are typically vibrations at the rotation frequency ($f_R$) of the rotor, and consequently a vibration at this frequency is not an optimal indicator of a demagnetisation fault. However, vibration at the rotation frequency ($f_R$) can be used to confirm the fault identification results obtained from the analysis at the supply frequency ($f_S$) of the stator. From the reference data a threshold value for the magnitude of the vibration at the rotation frequency ($f_R$) corresponding to a fault condition can be determined, and the fault identifier 24 is adapted to compare the magnitude of the vibration at the rotation frequency ($f_R$) with the threshold value. The determination of whether the machine suffers from demagnetization of a permanent magnet or not is done in a corresponding manner as when using the vibrations at the supply frequency ($f_S$) of the stator as the fault indicator.

The fault analyser 21 is suitably provided to present the result of the analysis, especially an identified demagnetisation fault, on a user interface in the form of a display 25. In addition, or alternatively, an audible alarm or other fault indication may be presented via a loudspeaker (not shown).

Apart from the sensor interface 22 for the vibration signal, which may arrive via a computer network, the fault analyser 21 is suitably provided with other sensor interfaces for interfacing other sensors, such as a contact 26 for receiving measurement signals from an additional sensor. Alternatively, the same interface may be arranged for receiving measurements from different measuring units. The fault analyser 21 exemplified in FIG. 2 includes a contact 26 for interfacing and receiving signals from another sensor, especially a current meter, which current meter (not illustrated) should be arranged for measuring the branch currents of the generator 1. The current signals are fed to a current analyser 27 provided to perform a frequency spectrum analysis, such as an FFT-analysis, and the current analyser 27 subsequently transfers the frequency spectrum magnitudes to the fault identifier 24. The fault identifier is adapted to identify faults indicated by magnitudes in the, or each, stator branch current spectrum, like electrical faults, e.g. inter-turn short-circuits of a stator winding.

The fault analyser 21 may be integrated in a portable service and control equipment, which may be connected to a vibration sensor fixed to a stator frame and arranged to obtain stator vibrations. The fault analyser 21 may alternatively be integrated into a control and monitoring equipment permanently arranged in a control room for monitoring and controlling the generator, such as in a control room at a wind power plant.

The spectrum analyser 23 and the fault identifier 24 are illustrated as separate entities, but can suitably be provided as a combination of software and hardware entities in a computer and for example share processor and memory. In the same computer, the current analyser 27 may suitably be integrated.

The magnetic fault monitoring method may be implemented as a computer program product, and include program steps to deduce whether a machine has a demagnetization fault. When the computer program is executed on a computer that receives vibration signals from a permanent magnet synchronous machine as input, the computer program should be adapted to discover whether the permanent magnet synchronous machine suffers from a demagnetization fault, or not. The program should be adapted to make technical considerations based on the vibrations of the permanent magnet synchronous machine, such as discovering a magnetic fault. Especially, the program is adapted to link demagnetization faults to operational parameters of the permanent magnet synchronous machine, such as the rotation frequency $f_R$ and/or the stator supply frequency $f_S$. By doing this, the program solves the technical problem of deducing whether a permanent magnet synchronous machine suffers from a demagnetization fault or not, taking technical characteristics of the machine into consideration, i.e. operational frequencies of the machine, when analysing the physically obtained vibrations of the machine. The program should suitably also be adapted to provide an output of the result of the deduction to an operator.

FIG. 3 illustrates a vibration spectrum of a permanent magnet synchronous generator having a demagnetised permanent magnet. The vibration magnitude at the stator supply frequency $f_S$, as well as the vibration magnitude at the rotation frequency of the rotor $f_R$ is affected and both magnitudes are higher than normal, especially the vibration magnitude at the stator supply frequency $f_S$. Similarly, signatures of geometric and electric faults should suitably be identified in the frequency spectrum of the vibration signal.

A system, method and program product for discovering demagnetisation faults of a permanent magnet synchronous generator, such as a wind power generator has been described. The method is performed during operation of the synchronous generator and includes measuring the vibration of the stator, performing a frequency analysis of the vibration, and deducing, from the vibration analysis, whether the generator suffers from demagnetization of a permanent magnet.

What is claimed is:

1. A method for monitoring demagnetization of permanent magnets in a synchronous machine, such as a wind power generator, having a stator with windings and a rotor with permanent magnets being arranged to rotate in relation to the stator, the method being performed during operation of the synchronous machine, and the method including the steps of:
   measuring with a vibration sensor the vibration of the stator,
   performing with an analyzer a frequency analysis of the vibration,
   determining with an identifier, on the basis of whether the magnitude of the vibration at the supply frequency of the stator exceeds a threshold value or not, whether the machine suffers from demagnetization of a permanent magnet or not.

2. The method according to claim 1, wherein the method further comprises the step of: determining, on the basis of whether the magnitude of the vibration at the rotation frequency exceeds a threshold value or not, whether the machine suffers from demagnetization of a permanent magnet or not.

3. The method according to claim 1, wherein the vibration measurement includes detecting vibrations by means of a vibration sensor that is fixed to a frame of the stator or fixed to the stator.

4. The method according to claim 1, wherein the machine is a permanent magnet synchronous generator.

5. The method according to claim 1, wherein the vibration measurement includes detecting vibrations with an accelerometer.

6. The method according to claim 1, wherein the method is implemented in a control system of a wind power plant.

7. The method according to claim 1, further comprising the step of presenting an alarm indicating a fault.

8. The method according to claim 1, wherein the step of determining includes analyzing reference data including magnitude levels corresponding to levels of demagnetization.

9. A system for monitoring demagnetization of permanent magnets in a synchronous machine having a stator with windings and a rotor with permanent magnets being arranged to rotate in relation to the stator, comprising:
   a vibration sensor measuring vibration of the stator,
   an analyzer performing a frequency analysis of the vibration,
   an identifier determining, on the basis of whether the magnitude of the vibration at the supply frequency of the stator exceeds a threshold value or not, whether the machine suffers from demagnetization of a permanent magnet or not.

10. The system according to claim 9, further comprising a memory having reference data including magnitude levels corresponding to levels of demagnetization.

11. The system according to claim 9, wherein the identifier confirms a fault indication on the basis of whether the magnitude of the vibration at the rotation frequency exceeds a threshold value or not.

12. The system according to claim 9, further comprising a display displaying an indication of a fault.

13. The system according to claim 9, wherein the machine comprises a permanent magnet synchronous generator.

14. The system according to claim 9, wherein the vibration sensor comprises an accelerometer.

15. The system according to claim 9, wherein the analyzer is integrated into portable control equipment.

16. The system according to claim 9, wherein the analyzer is integrated into in a control system of a wind power plant.

17. The method according to claim 1, wherein the step of determining comprises determining demagnetization from vibrations alone.

18. The method according to claim 8, wherein the reference data is created by measuring operation using a permanent magnet that is less strong than a nominal magnetic strength normally used.

\* \* \* \* \*